(12) United States Patent
Espino

(10) Patent No.: US 10,193,454 B2
(45) Date of Patent: *Jan. 29, 2019

(54) OVERVOLTAGE PROTECTION CIRCUIT

(71) Applicant: Power Integrations, Inc., San Jose, CA (US)

(72) Inventor: Marvin Cruz Espino, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 42 days.

This patent is subject to a terminal disclaimer.

(21) Appl. No.: 15/161,614

(22) Filed: May 23, 2016

(65) Prior Publication Data
US 2016/0268911 A1    Sep. 15, 2016

Related U.S. Application Data

(63) Continuation of application No. 13/736,596, filed on Jan. 8, 2013, now Pat. No. 9,368,961.

(51) Int. Cl.
| | |
|---|---|
| *H02M 3/335* | (2006.01) |
| *H02H 7/12* | (2006.01) |
| *H02M 1/32* | (2007.01) |
| *G01R 19/165* | (2006.01) |
| *H02M 1/08* | (2006.01) |
| *H02M 1/00* | (2006.01) |

(52) U.S. Cl.
CPC .... *H02M 3/33515* (2013.01); *G01R 19/1659* (2013.01); *H02H 7/1213* (2013.01); *H02M 1/08* (2013.01); *H02M 1/32* (2013.01); *H02M 3/33507* (2013.01); *H02M 2001/0009* (2013.01)

(58) Field of Classification Search
CPC ...... H02M 1/08; H02M 1/32; H02M 3/33507; H02M 3/3515; H02M 2001/0009; H02M 3/33515; H02M 3/33523; H02H 7/1213; H02H 7/12; G01R 19/1659
USPC ....................................................... 363/56.11
See application file for complete search history.

(56) References Cited

U.S. PATENT DOCUMENTS

| | | | | |
|---|---|---|---|---|
| 5,740,026 | A | * | 4/1998 | Karol ....................... H02M 1/44 363/142 |
| 5,872,704 | A | | 2/1999 | Kim |
| 5,995,384 | A | * | 11/1999 | Majid ............... H02M 3/33523 323/902 |
| 9,368,961 | B2 | * | 6/2016 | Espino ................. H02H 7/1213 |

(Continued)

*Primary Examiner* — Harry Behm
*Assistant Examiner* — Lorena Bruner
(74) *Attorney, Agent, or Firm* — Christensen O'Connor Johnson Kindness PLLC

(57) ABSTRACT

An overvoltage detection circuit for a power converter a current augmentation circuit coupled to receive a sense signal representative of an output voltage of the power converter only during a portion of an off time of a power switch of the power converter. The current augmentation circuit is further coupled to output an augmented signal. A detection circuit is coupled to receive the augmented signal from the augmentation circuit and a power signal representative of a rectified version of the sense signal at a same input terminal. The detection circuit is operable to output an overvoltage detection signal based at least in part on the augmented signal, the overvoltage detection signal being representative of an overvoltage condition in the output voltage of the power converter.

31 Claims, 5 Drawing Sheets

(56) References Cited

U.S. PATENT DOCUMENTS

| | | |
|---|---|---|
| 2003/0086224 A1* | 5/2003 | Elms ............... H02H 3/338 |
| | | 361/91.1 |
| 2003/0123265 A1* | 7/2003 | Uchida ............ H02M 1/32 |
| | | 363/21.12 |
| 2006/0071614 A1 | 4/2006 | Tripathi et al. |
| 2008/0247202 A1 | 10/2008 | Djenguerian et al. |
| 2009/0180302 A1 | 7/2009 | Kawabe et al. |
| 2010/0182808 A1* | 7/2010 | Sato ............... H02M 3/33592 |
| | | 363/21.18 |
| 2011/0141776 A1* | 6/2011 | Lin ................. H02H 7/125 |
| | | 363/53 |
| 2011/0316446 A1 | 12/2011 | Kang et al. |
| 2012/0320640 A1 | 12/2012 | Baurle et al. |
| 2014/0192569 A1 | 7/2014 | Espino |
| 2015/0270701 A1 | 9/2015 | Cambefort et al. |

* cited by examiner

OVERVOLTAGE PROTECTION CIRCUIT

CROSS-REFERENCE TO RELATED APPLICATIONS

This application is a continuation of U.S. patent application Ser. No. 13/736,596, filed Jan. 8, 2013, now pending. U.S. patent application Ser. No. 13/736,596 is hereby incorporated by reference.

BACKGROUND

1. Field

The present disclosure relates generally to power converters and, in particular but not exclusively, relates to accurately sensing output overvoltage conditions.

2. Description of Related Art

Many electronic devices, such as cell phones, laptop computers, etc., use direct current (dc) power to operate. Conventional wall outlets generally deliver a high voltage alternating current (ac) power that needs to be transformed to dc power in order to be used as a power source by most electronic devices. Switch mode power converters are commonly used due to their high efficiency, small size, and low weight to convert the high voltage ac power to a regulated dc power. In operation, a switch is used to provide a desired output by switching at a variable duty ratio (typically, the ratio of on-time of the switch to total switching period) or by varying the number of ON and OFF cycles of the switch per unit time.

A switch mode power converter may also employ a controller that typically provides output regulation by sensing the output and controlling the switch in a closed loop. The controller may receive a feedback signal representative of the output and then vary one of the control parameters (e.g., duty ratio or the number of ON and OFF cycles of the switch per unit time) based on the feedback signal to regulate the output to a desired quantity.

Some switch mode power converters may have a coupled inductor, also referred to as a transformer, which can be used to both transfer energy and provide galvanic isolation between the input and the output of a power converter. A transformer typically includes two windings: a primary winding coupled to the input of a power converter and a secondary winding coupled to the output of the power converter; but in some cases, the transformer may also include a third winding, which may be referred to as a bias winding, to be used for various different purposes. In one example, a bias winding may be used to supply power to a controller of a power converter. In another example, a bias winding may be used to provide a feedback signal to a controller. In yet another example, a bias winding may be used to detect an overvoltage condition at the output of a power converter.

A controller of a switch mode power converter may have an input terminal coupled to a bias winding to realize multiple functions, such as powering the controller, detecting the overvoltage condition, etc. In one example, a bias winding signal representative of the voltage across the bias winding (e.g., bias winding voltage) may be used to provide a power signal to the input terminal for powering the controller. Since the bias winding voltage may be representative of the output (e.g., the output voltage) of the power converter, the same bias winding signal may also be used for detecting the overvoltage condition from the same input terminal.

DESCRIPTION OF THE FIGURES

Non-limiting and non-exhaustive embodiments of the present invention are described with reference to the following figures, wherein like reference numerals refer to like parts throughout the various views unless otherwise specified.

DETAILED DESCRIPTION

Figure 1:
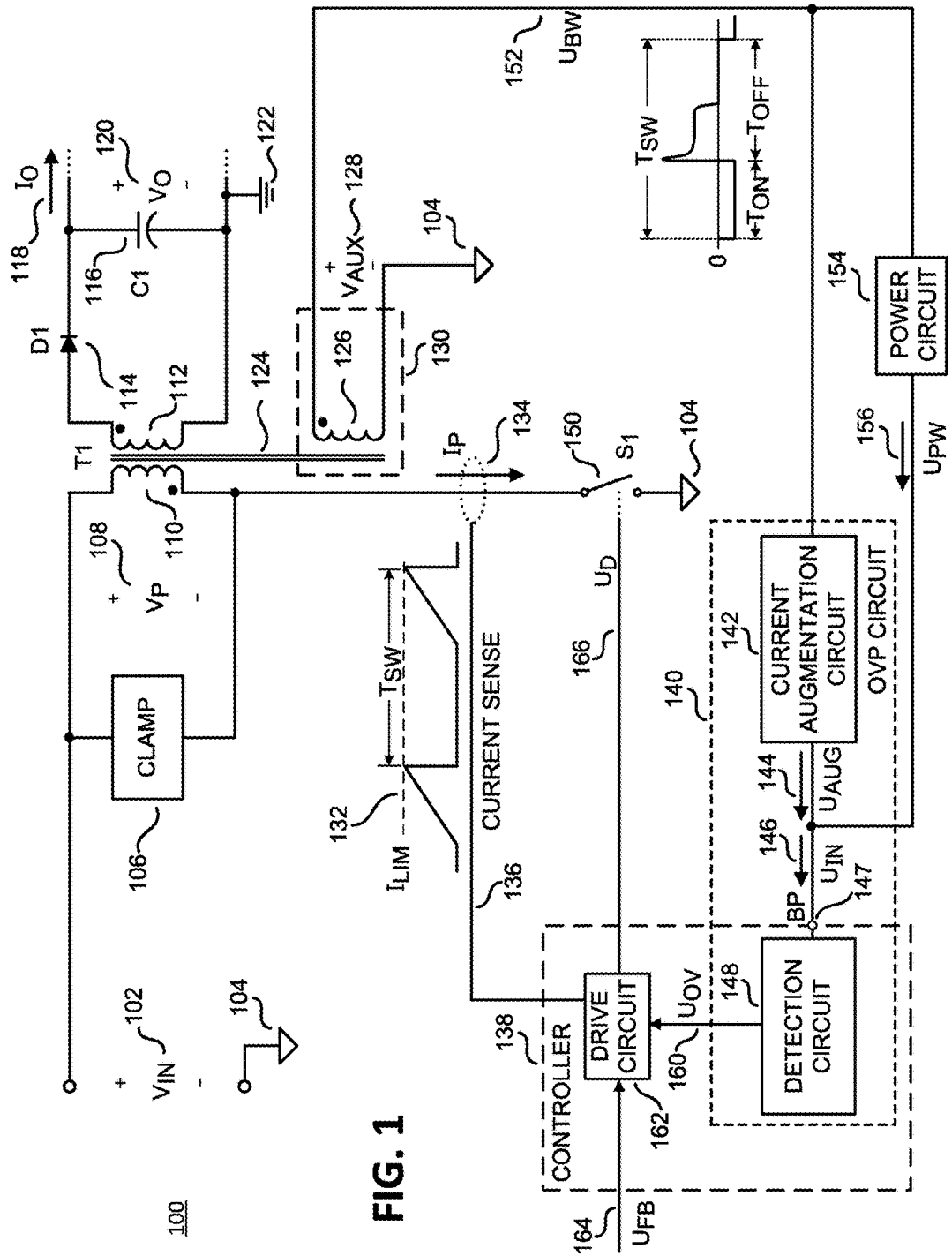
FIG. 1 is a schematic diagram illustrating an example power converter including an overvoltage protection (OVP) circuit in accordance with the teachings of the present disclosure.

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As mentioned above, a power converter controller may have an input terminal coupled to a bias winding of a transformer to realize many functions, such as powering the controller, detecting an overvoltage condition at the output, etc. In some cases, the signal powering the controller may be generated in response to the bias winding signal that is representative of the bias winding voltage. Because the bias winding signal may also be representative of the output (e.g., output voltage) of the power converter, the same bias winding signal may also be useful for detecting an overvoltage condition at the output of the power converter. Using the same bias winding signal and the same input terminal for both supplying power and detecting the overvoltage condition may reduce circuit component parts and lower the cost of the power converter.

The bias winding signal may represent the output of the power converter only when the switch of the power converter is OFF (i.e., during the off-time of the switch). However, the bias winding signal typically has a transient portion corresponding to a spike (e.g., a significant fluctuation in voltage level over a short period time) in the bias winding voltage that occurs due to switching and parasitic components (e.g., parasitic inductance of the bias winding) of the transformer when the switch of power converter is turned OFF. Since the bias winding signal may not represent the output of power converter (e.g., may represent a voltage that is greater than the output voltage of the power converter) during the transient portion, the detection of the overvoltage condition based on the bias winding signal may not be as accurate as desired.

A filtered bias signal may be generated by filtering the transient portion of the bias winding signal. The filtered bias signal may be provided to the input terminal of the controller in combination with the signal powering the controller. This may allow for the bias winding signal and the input terminal to be used not only for supplying power to controller but also for accurately detecting the overvoltage condition.

According to the teachings of the present disclosure, an apparatus and method for generating an overvoltage signal from a bias winding signal of a power converter transformer are disclosed. In one example, an overvoltage protection circuit may include a current augmentation circuit and a detection circuit. The current augmentation circuit may be coupled to receive the bias winding signal, which may be representative of the power converter output. The current augmentation circuit may include a threshold circuit and a filter circuit that may generate a filtered level shifted signal from the bias winding signal. The current augmentation circuit may generate an augmented signal from the filtered level shifted signal. The detection circuit may be coupled to receive the augmented signal and to generate an overvoltage signal by comparing the augmented signal with a reference voltage. When high asserted, the overvoltage signal may indicate a potential overvoltage condition at the output of the power converter. In some embodiments, a power circuit may also be coupled to receive the bias winding signal, and may generate a power signal that may provide power to the controller at a level below that which would cause the detection circuit to indicate an overvoltage condition. In one embodiment, the detection circuit may be coupled to receive the sum of the augmented signal and the power signal.

FIG. 1 illustrates an example power converter 100, also referred to as a power supply, with OVP circuit 140 in accordance with the teachings of the present disclosure. In the illustrated example, power converter 100 may receive an input voltage $V_{IN}$ 102, also referred to as a line voltage, to produce an output voltage $V_O$ 120 and an output current $I_O$ 118 to a load (not shown). In one example, input voltage $V_{IN}$ 102 may be a rectified and filtered ac voltage. Input voltage $V_{IN}$ 102 may be positive with respect to a primary ground 104 (also referred to as an input return) and output voltage $V_O$ 120 may be positive with respect to a secondary ground 122 (also referred to as an output return). In other examples, power converter 100 may have more than one output.

Power converter 100 of FIG. 1 may include an energy transfer element T1 124 and a switch $S_1$ 150. Switch $S_1$ 150 may represent the operation of a controlled semiconductor device, such as, for example, a metal oxide semiconductor field effect transistor (MOSFET) or a bipolar junction transistor (BJT). As further shown, controller 138 of power converter 100 may receive a current sense signal 136, a feedback signal $U_{FB}$ 164, and an input signal $U_{IN}$ 146. Controller 138 may be implemented as a monolithic integrated circuit, with discrete electrical components, or a combination of discrete and integrated components. Controller 138 and switch $S_1$ 150 may form part of an integrated control circuit that is manufactured as either a hybrid or a monolithic integrated circuit.

In the example power converter 100, energy transfer element T1 124 is a coupled inductor, also referred to as a transformer, and is illustrated with three windings and may provide galvanic isolation between the input and the output of power converter 100, although other configurations are contemplated. Galvanic isolation may prevent dc current between the input and the output of the power converter. In other words, a dc voltage applied between an input terminal and an output terminal of power converter 100 may produce little to no dc current between the input terminal and the output terminal of power converter 100. Winding 110 may be a primary winding that has one end coupled to input voltage $V_{IN}$ 102 and the opposite end coupled to switch $S_1$ 150, which is shown in the example as coupled to input return 104. Winding 112 may be a secondary winding that has one end coupled to output return 122 and the opposite end coupled to rectifier D1 114. In the example power converter 100, rectifier D1 114 may include a diode, but in an alternative embodiment, rectifier D1 114 may include a switch used as a synchronous rectifier. Winding 126 may be a sense winding, sometimes referred to as a bias winding, with one end coupled to input return 104. The polarities of the windings, indicated by the dots at one end of each winding (dotted ends each having the same polarity), show that power converter 100 may be configured as a flyback power converter. However, it is appreciated that other known topologies and configurations of switched mode power converters may also benefit from the teachings of the present disclosure.

In operation of example power converter 100, controller 138 may produce drive signal $U_D$ 166 that may open and close switch $S_1$ 150 within repetitive switching periods $T_{SW}$. When switch $S_1$ 150 is closed (also referred to as being ON or being in an ON state), switch $S_1$ 150 may cause primary current $I_P$ 134 to be conducted in primary winding 110 of energy transfer element 124. When switch $S_1$ 150 is open (also referred to as being OFF or being in an OFF state), switch $S_1$ 150 may prevent or at least substantially prevent current from being conducted through switch $S_1$ 150 and primary winding 110 of energy transfer element 124. When switch $S_1$ 150 is ON, voltage $V_P$ 108 across the primary winding 110 of energy transfer element 124 may become substantially equal to input voltage $V_{IN}$ 102. While switch $S_1$ 150 remains in the ON state, primary current $I_P$ 134 may increase linearly until it reaches current limit $I_{LIM}$ 132 which, in one example, is a fixed limit. During this time, there may be substantially no current in secondary winding 112 and in bias winding 126, and coupled inductor T1 124 may store energy in primary winding 110.

In the example power converter 100, when primary current $I_P$ 134 reaches current limit $I_{LIM}$ 132, controller 138 may open switch $S_1$ 150. Subsequently, the energy stored from the primary winding 110 while switch $S_1$ 150 was conducting may begin to transfer to secondary winding 112. This transfer of energy caused by the switching of switch $S_1$ 150 between ON states and OFF states may produce a pulsating current in secondary winding 112, which may in turn be rectified by rectifier D1 114 and filtered by capacitor C1 116 to produce a substantially constant output voltage $V_O$ 120, output current $I_O$ 118, or a combination of the two at a load. Clamp circuit 106 may be coupled across primary winding 110 to limit the voltage across switch $S_1$ 150 when switch $S_1$ 150 opens.

Closing and opening of switch $S_1$ 150 may produce voltage $V_{AUX}$ 128 on bias winding 126 that may be related by transformer action to the voltages on primary winding 110 and secondary winding 112. When switch $S_1$ 150 is ON, voltage $V_{AUX}$ 128 may be negative with respect to input return 104 with a magnitude that is substantially equal to input voltage $V_{IN}$ 102 scaled by a turns ratio that is the number of turns on winding 126 divided by the number of turns on winding 110 of coupled inductor T1 124. When switch $S_1$ 150 turns OFF and diode D1 114 is forward biased (conducting current), voltage $V_{AUX}$ 128 may become positive with respect to input return 104 with a magnitude that may be substantially equal to output voltage $V_O$ 120 plus the voltage across diode D1 114, the sum scaled by the turns ratio that is the number of turns on winding 126 divided by the number of turns on winding 112. In some cases, diode D1 114 may stop conducting current and become reverse biased at some point after switch $S_1$ 150 turns OFF, causing voltage $V_{AUX}$ 128 to become substantially equal to zero volts until switch $S_1$ 150 turns ON again.

In one example, controller 138 may sense primary current $I_P$ 134, which may also be the current in switch $S_1$ 150, as current sense signal 136. Any known means to sense current, such as, for example, receiving the voltage across a resistor conducting the current, receiving a scaled current from a current transformer, or receiving the voltage across the on-resistance of a MOSFET that conducts the current, may be used to sense primary current $I_P$ 134 and to provide current sense signal 136 to controller 138. The waveform of current sense signal 136 illustrated in FIG. 1 shows that power converter 100 may be operating in the discontinuous conduction mode (DCM), which is typical for operation at light loads. A distinguishing characteristic of operation in DCM is that primary current $I_P$ 134 may be substantially zero shortly after switch $S_1$ 150 turns ON. At higher loads, the power converter typically operates in the continuous conduction mode (CCM), which may be distinguished by a jump in primary current $I_P$ 134 from substantially zero to a finite positive value shortly after switch $S_1$ 150 turns ON (not shown in FIG. 1).

In addition, power converter 100 may further include circuitry to regulate an output quantity, which may include output voltage $V_O$ 120 and/or output current $I_O$ 118, to a desired value. For example, a sense circuit (not shown) may be coupled to the output of power converter 100 or to bias winding 126 of power converter 100 and may provide to controller 138 feedback signal $U_{FB}$ 164 that is representative of the output quantity.

Power converter 100 may also include a power circuit 154 coupled to bias winding 126 and to an input terminal BP 147 of controller 138. In operation, power circuit 154 may receive a bias signal $U_{BW}$ 152 (also referred to as a sense signal), which in one example is the voltage across bias winding 126, and may generate power signal $U_{PW}$ 156 that may provide power to controller 138. The waveform of bias signal $U_{BW}$ 152 illustrated in FIG. 1 shows one example including an on-time portion $T_{ON}$ and an off-time portion $T_{OFF}$ during a switching period $T_{SW}$. Additional details of an example cycle of bias signal $U_{BW}$ 152 are discussed below with reference to FIG. 3. Further shown in FIG. 1 is current augmentation circuit 142 that may be coupled to bias winding 126 to receive bias signal $U_{BW}$ 152 and further coupled to input terminal BP 147 to provide an augmented current signal $U_{AUG}$ 144 to controller 138.

Controller 138 may also include detection circuit 148, which may be coupled to receive input signal $U_{IN}$ 146 representative of the sum of augmented current signal $U_{AUG}$ 144 and power signal $U_{PW}$ 156. Based on input signal $U_{IN}$ 146, detection circuit 148 may output overvoltage signal $U_{OV}$ 160 that is representative of an overvoltage condition at the output of the power converter. In the illustrated power converter 100, detection circuit 148 of controller 138 in combination with current augmentation circuit 142 may form OVP circuit 140.

As further illustrated in FIG. 1, controller 138 may include drive circuit 162 that may be coupled to receive overvoltage signal $U_{OV}$ 160, feedback signal $U_{FB}$ 164, and current sense signal 136, and may produce drive signal $U_D$ 166 to control the switching of switch $S_1$ 150. Drive circuit 162 may include various analog and digital circuits, such as, for example, logic gates (not shown), pulse width modulator (PWM) (not shown), and oscillators (not shown), to provide the desired relationships among overvoltage signal $U_{OV}$ 160, feedback signal $U_{FB}$ 164, current sense signal 136, and drive signal $U_D$ 166. In one example, drive circuit 162 may use overvoltage signal $U_{OV}$ 160 to identify an overvoltage condition at the output of power converter 100 and to adjust drive signal $U_D$ 166 accordingly.

Figure 2:
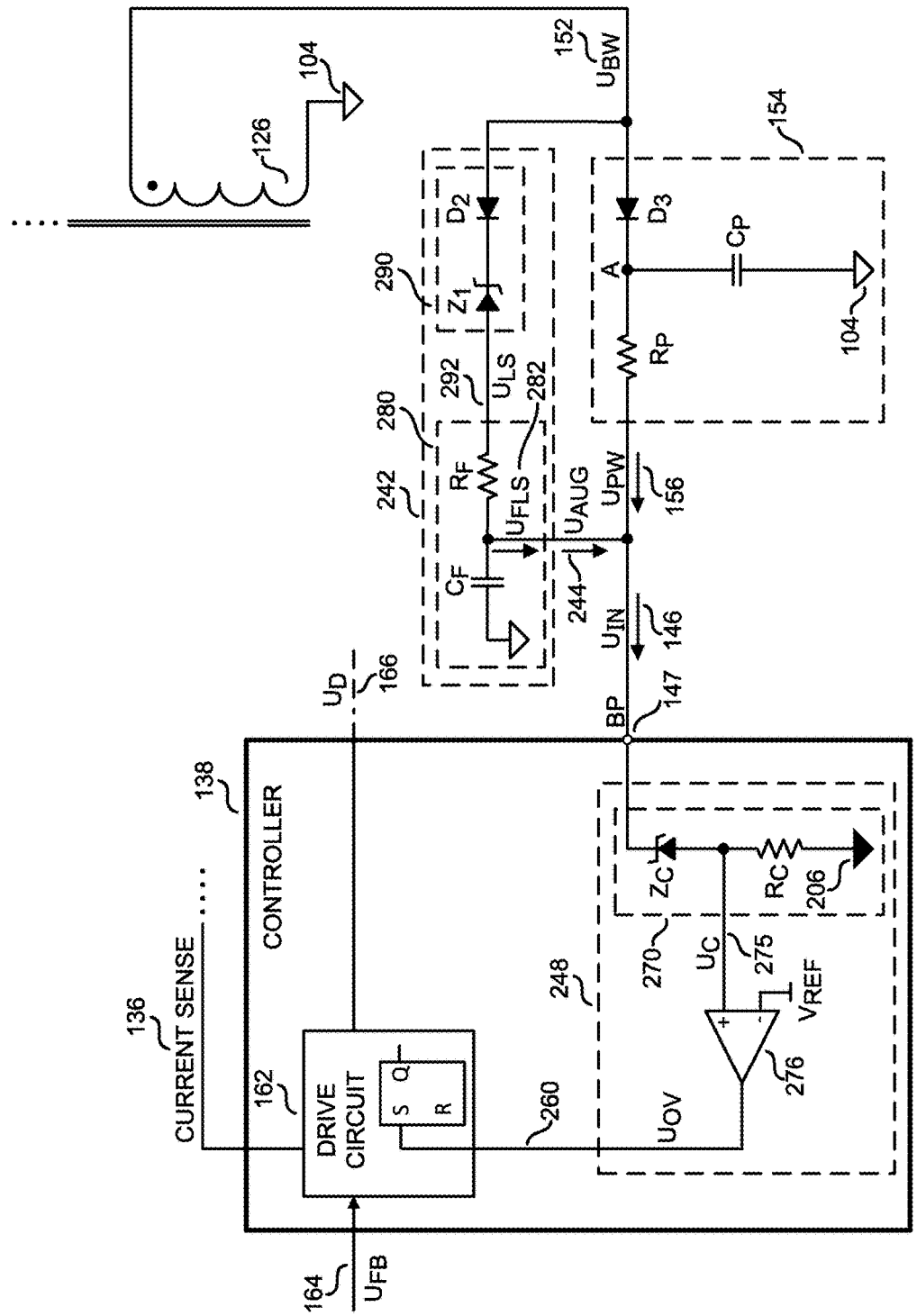
FIG. 2 is a circuit diagram illustrating an example OVP circuit that can be used in the power converter of FIG. 1 in accordance with the teachings of the present disclosure.

FIG. 2 illustrates example circuitry that may be used in a power converter, such as power converter 100 of FIG. 1. FIG. 2 illustrates current augmentation circuit 242 as well as detection circuit 248, which together may make up an example OVP circuit. Such an OVP circuit may, in one example, be the same as OVP circuit 140 illustrated in FIG. 1.

As illustrated, current augmentation circuit 242 of the example OVP circuit may be coupled between bias winding 126 and input terminal BP 147 of controller 138. Detection circuit 248 of the example OVP circuit may be inside controller 138 and may be coupled to input terminal BP 147. Input terminal BP 147 may be further coupled to receive input signal $U_{IN}$ 146, which may include power signal $U_{PW}$ 156 from power circuit 154 and an augmented signal $U_{AUG}$ 244 from current augmentation circuit 242. Power circuit 154 may include rectifier $D_3$ coupled between the input of power circuit 154 and node A, capacitor $C_P$ coupled between node A and input return 104, and resistor $R_P$ coupled between node A and the output of power circuit 154. In one embodiment, rectifier $D_3$ may include a diode. Capacitor $C_P$ may store the rectified bias signal $U_{BW}$ 152, and resistor $R_P$ may set the magnitude of power signal $U_{PW}$ 156 that may be received at input terminal BP 147 of controller 138. In one example, power signal $U_{PW}$ 156 may provide at least 1 mA of current to input terminal BP 147 under normal operating conditions (e.g., when the output of power converter 100 is in its operating range).

Current augmentation circuit 242 may receive bias signal $U_{BW}$ 152 from bias winding 126, and may generate augmented signal $U_{AUG}$ 244. In one example, augmented signal $U_{AUG}$ 244 is the same as augmented signal $U_{AUG}$ 144 of current augmentation circuit 142 of FIG. 1. Current augmentation circuit 242 may include threshold circuit 290 and filter circuit 280 as shown. In another embodiment (not shown), a filter circuit may be inside the controller 138, the input of the filter circuit may be coupled to the input terminal BP 147 of the controller 138, and the output of the filter circuit may be coupled to a detection circuit, such as detection circuit 248 of controller 138. In such a modified embodiment, the filter circuit may also be part of the detection circuit.

Referring again to the embodiment illustrated in FIG. 2, threshold circuit 290 may be coupled to receive bias signal $U_{BW}$ 152 from bias winding 126. Threshold circuit 290 may output level shifted signal $U_{LS}$ 292 to filter circuit 280. In one embodiment, threshold circuit 290 may include a diode $D_2$ coupled to a Zener diode $Z_1$. In other embodiments, threshold circuit 290 may include a different number of diodes, Zener diodes, Schottky diodes, or the like.

In operation, threshold circuit 290 may reduce the magnitude of its input signal, which in this example may be bias signal $U_{BW}$ 152, to produce its output signal $U_{LS}$ 292. Threshold circuit 290 may reduce the input signal by an amount that is equal to the sum of the forward voltage of the diode $D_2$ and the breakdown voltage of the Zener diode $Z_1$. In one example, the diode $D_2$ may have a forward voltage of 1 volt and the Zener diode $Z_1$ may have a breakdown voltage of 5 volts. In such an example, the magnitude of the output level shifted signal $U_{LS}$ 292 may be 6 volts less than the magnitude of the input bias signal $U_{BW}$ 152.

As illustrated, filter circuit 280 may be coupled to receive as an input level shifted signal $U_{LS}$ 292 from threshold circuit 290. Filter circuit 280 may output filtered level shifted signal $U_{FLS}$ 282. In one embodiment, filter circuit 280 may include a resistor $R_F$ coupled between the input and the output of filter circuit 280. Filter circuit 280 may also include a capacitor $C_F$ coupled between the output of filter circuit 280 and input return 104.

The values of resistor $R_F$ and capacitor $C_F$ of filter circuit 280 may determine certain characteristics of filter circuit 280, such as, for example, a cut-off frequency. In the example illustrated in FIG. 2, filter circuit 280 may be configured to reduce the magnitude of input signals that are at or above the cut-off frequency. For such input signals at or above the cut-off frequency, filter circuit 280 may reduce the magnitude by an attenuation rate, which may be the rate at which the magnitude is reduced for such signals. In one embodiment, the attenuation rate may be at least 50%. It should be appreciated that filter circuit 280 may be configured differently with different components and different component values to produce lower or higher attenuation rates for input signals that are at or above any desired cut-off frequency.

As mentioned above, the example OVP circuit may include detection circuit 248, which may be coupled to input terminal BP 147 of controller 138. Detection circuit 248 may receive input signal $U_{IN}$ 146 that is representative of the sum of power signal $U_{PW}$ 156 and augmented signal $U_{AUG}$ 244. In one embodiment, augmented signal $U_{AUG}$ 244 may be the same as filtered level shifted signal $U_{FLS}$ 282.

As illustrated in FIG. 2, detection circuit 248 may generate overvoltage signal $U_{OV}$ 260 based on input signal $U_{IN}$ 146. In one example, overvoltage signal $U_{OV}$ 260 is the same as overvoltage signal $U_{OV}$ 160 of detection circuit 148. Detection circuit 248 may be coupled to provide overvoltage signal $U_{OV}$ 260 to drive circuit 162. Drive circuit 162 may include a latch coupled to receive overvoltage signal $U_{OV}$ 260 as an input. The latch may output a latched signal that goes to logic high when overvoltage signal $U_{OV}$ 260 is asserted (i.e., when overvoltage signal $U_{OV}$ 260 becomes logic high), and may maintain the latched signal at the logic high level until the latch is reset (and the latch output is set to logic low). In one embodiment, the latched signal output by the latch may be coupled to adjust drive signal $U_D$ 166 or otherwise cause drive signal $U_D$ 166 to be altered. In one example, controller 138 may cause power converter 100 to shut down when the latched signal becomes logic high, which may indicate an overvoltage condition. As illustrated in the example in FIG. 2, drive circuit 162 may include an SR latch with input terminal S that may be coupled to receive overvoltage signal $U_{OV}$ 260, an output terminal Q that may output a logic high signal when overvoltage signal $U_{OV}$ 260 is asserted, and an input terminal R that may be coupled to reset the latch when the voltage at input terminal BP 147 of controller 138 drops to a certain level (e.g., 4.9 volts).

Detection circuit 248 may include a clamp circuit 270. Clamp circuit 270 may include a resistor $R_C$, which may be coupled between a ground terminal 206, a Zener diode $Z_C$, and a comparator 276. Zener diode $Z_C$ may be coupled between the input and the output of clamp circuit 270. In one embodiment, the anode of Zener diode $Z_C$ may be coupled to resistor $R_C$ and comparator 276, and the cathode of Zener diode $Z_C$ may be coupled to the input of clamp circuit 270. Ground terminal 206 may be the same as input return 104, or, in other embodiments, may be different.

Clamp circuit 270 may be configured to set the voltage at input terminal BP 147 to a fixed value when there is current in clamp circuit 270. For example, when Zener diode $Z_C$ is conducting current, voltage at input terminal BP 147 may be fixed. In one embodiment, Zener diode $Z_C$ and resistor $R_C$ may be chosen such that the fixed voltage value at input terminal BP 147 is 6.4 volts. In addition to setting a voltage on input terminal BP 147, clamp circuit 270 may output a comparison signal $U_C$ 275 which, in one example, may be the voltage across resistor $R_C$.

Detection circuit 248 may also include comparator 276. Comparator 276 may be coupled to receive comparison signal $U_C$ 275 and to output overvoltage signal $U_{OV}$ 260. In one embodiment, comparator 276 may compare comparison signal $U_C$ 275 with a reference voltage $V_{REF}$, and may generate overvoltage signal $U_{OV}$ 260 that has logic high and logic low levels. In some embodiments, comparator 276 may include an operational amplifier with a non-inverting terminal (indicated with a plus sign in FIG. 2) and an inverting terminal (indicated with a minus sign in FIG. 2). Comparison signal $U_C$ 275 may be coupled to the non-inverting terminal, and the reference voltage $V_{REF}$ may be coupled to the inverting terminal, as illustrated in FIG. 2.

As illustrated in the example in FIG. 2, the values for resistor $R_C$ and the reference voltage $V_{REF}$ may be chosen such that when input signal $U_{IN}$ 146 is 5.5 mA or greater, comparison signal $U_C$ 275 becomes equal to or greater than the reference voltage $V_{REF}$. In one embodiment, when comparison signal $U_C$ 275 is equal to or greater than the reference voltage $V_{REF}$, comparator 276 may output a logic high signal, and when comparison signal $U_C$ 275 is less than the reference voltage $V_{REF}$, comparator 276 may output a logic low signal.

With continued reference to FIG. 2, an example OVP circuit will now be described with selected values to further illustrate potential operation of the example OVP circuit in a power converter (e.g., power converter 100). To assert overvoltage signal $U_{OV}$ 260 as a logic high signal to indicate an overvoltage condition at the output of the power converter, at least 5.5 mA of current may be required at input terminal BP 147 of controller 138. Power circuit 154 may provide 1 mA of current with power signal $U_{PW}$ 156, which may contribute to input signal $U_{IN}$ 146 received at input terminal BP 147. In an overvoltage condition, current augmentation circuit 242 may provide at least 4.5 mA of current with augmented signal $U_{AUG}$ 244, which may combine with power signal $U_{PW}$ 156 to generate input signal $U_{IN}$ 146 received at input terminal BP 147. As such, the total current at input terminal BP 147 becomes at least 5.5 mA, which may be sufficient to cause detection circuit 248 to indicate an overvoltage condition by asserting a logic high signal as overvoltage signal $U_{OV}$ 260. The voltage at input terminal BP 147 may be clamped to 6.4 volts.

The trip point, also referred to as the overvoltage threshold, causing current augmentation circuit 242 to output 4.5 mA of current on augmented signal $U_{AUG}$ 244 may be set by selecting values for diode $D_2$, Zener diode $Z_1$, and resistor $R_F$. In one example, overvoltage threshold may correspond to a minimum voltage at the output of the power converter that indicates an overvoltage condition. In the illustrated example, overvoltage threshold may also correspond to a minimum voltage on bias signal $U_{BW}$ 152 that indicates an overvoltage condition because bias signal $U_{BW}$ 152 is representative of output voltage $V_O$ 120 of power converter 100. As such, overvoltage threshold can be determined as a sum of 6.4 volts (or the clamped voltage at input terminal BP 147), the forward voltage of diode $D_2$, the breakdown voltage of Zener diode $Z_1$, and the minimum voltage drop across resistor $R_F$ during an overvoltage condition (4.5 mA multiplied by the resistance of resistor $R_F$). Thus, overvoltage threshold may be set as desired by selecting particular values for the components of the example OVP circuit.

Figure 3:
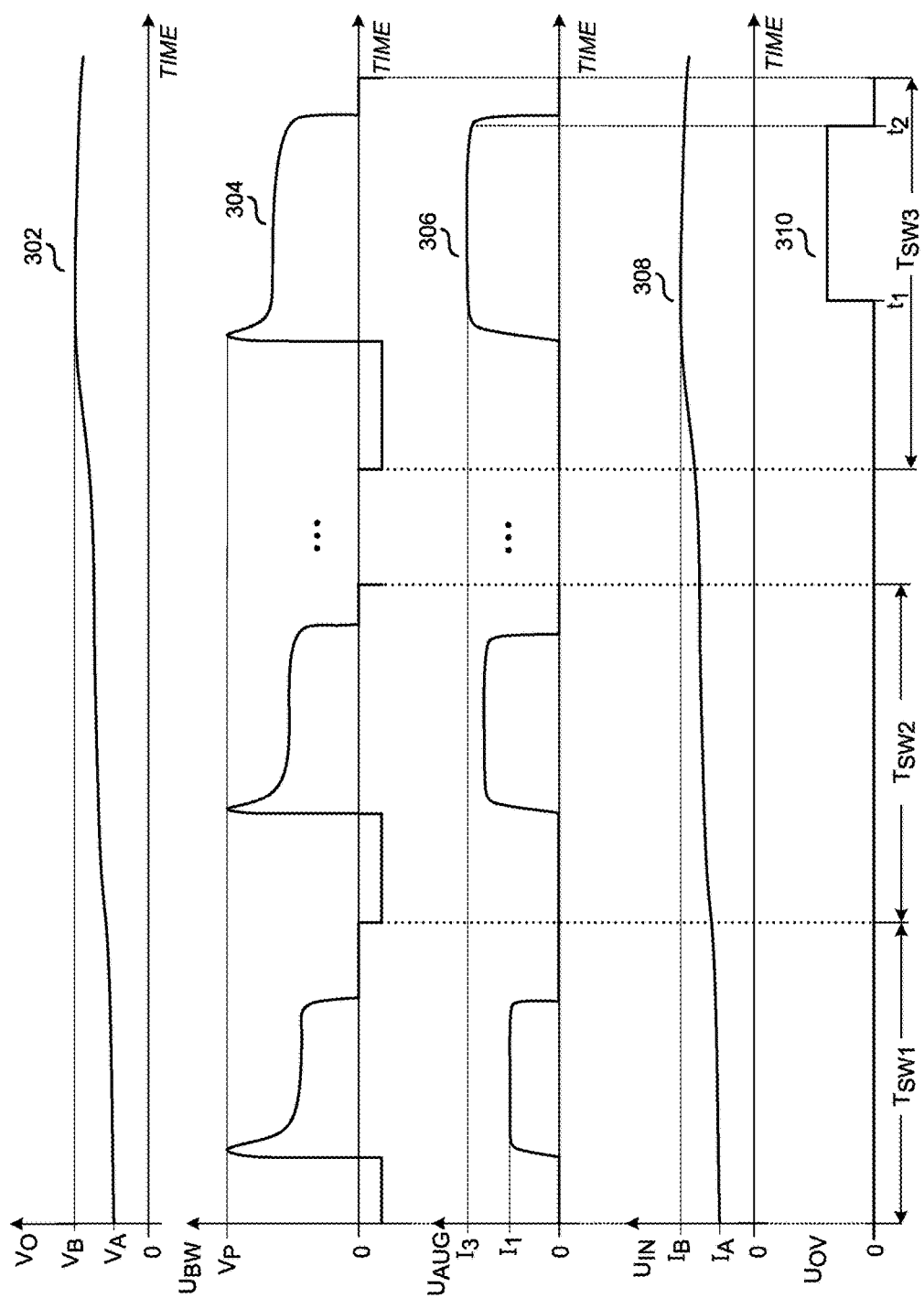
FIG. 3 is a timing diagram showing example waveforms for various signals that are associated with the OVP circuit of FIG. 2 and the power converter of FIG. 1 in accordance with the teachings of the present disclosure.

FIG. 3 illustrates example waveforms for signals that may be associated with the example OVP circuit, which is illustrated as current augmentation circuit 242 and detection circuit 248 in FIG. 2, and power converter 100 illustrated in FIG. 1. In one example, waveform 302 may represent output voltage $V_O$ 120 of FIG. 1. Waveform 304 may represent bias signal $U_{BW}$ 152 of either FIG. 1 or FIG. 2. Waveform 306 may represent augmented signal $U_{AUG}$ 144 or 244 of FIG. 1 or FIG. 2, respectively. Waveform 308 may represent input signal $U_{IN}$ 146 of either FIG. 1 or FIG. 2. Waveform 310 may represent overvoltage signal $U_{OV}$ 160 or 260 of FIG. 1 or FIG. 2, respectively.

The waveforms of FIG. 3 are illustrated for three different time intervals $T_{SW1}$, $T_{SW2}$, and $T_{SW3}$, each of the same length or duration of switching period $T_{SW}$. The three time intervals may represent three different example switching cycles as output voltage $V_O$ 120 increases from voltage $V_A$ to voltage $V_B$. In one example, voltage $V_B$ may be 20% higher than voltage $V_A$.

The illustrated example bias signal $U_{BW}$ may be a periodic signal with a period equal to switching period $T_{SW}$. Bias signal $U_{BW}$ 152 may typically have two portions: an on-time portion where the signal is a constant negative voltage and an off-time portion where the magnitude of the signal varies. The off-time portion may be further broken down into zero and non-zero portions. Zero portions of the off-time bias signal may represent bias signal $U_{BW}$ 152 when an output diode (such as diode D1 of FIG. 1) is not conducting current (i.e., not conducting current to a load), and non-zero portions of the off-time bias signal may represent signal $U_{BW}$ 152 when the output diode is conducting current (i.e., conducting current to a load). Non-zero portions of the off-time bias signal may also be described as having two separate regions: a transient region where the bias signal $U_{BW}$ 152 may initially spike up to some level, such as a voltage level illustrated by voltage $V_P$ in FIG. 3, and come down to a lower level in a short interval (i.e., typically in the 200-300 ns range) and a constant region where the bias signal $U_{BW}$ 152 stays substantially constant at the lower level following the spike. The constant region of the non-zero portions of the off-time bias signal may be representative of the output voltage $V_O$ 120. The initial spike in the transient region of the non-zero portion of the off-time bias signal may be representative of when an output diode (such as diode D1 of FIG. 1) begins conducting current, and may be caused by parasitic reactive components (i.e., parasitic capacitance and inductance) of an energy transfer element (such as transformer T1 124 of FIG. 1).

An example operation of an OVP circuit will now be described with continued reference to FIG. 3 as well as the example circuits of FIG. 1 and FIG. 2 (although other circuit configurations are contemplated that may benefit from this disclosure). In one embodiment, current augmentation circuit 142 or 242 may receive bias signal $U_{BW}$ 152 and generate augmented signal $U_{AUG}$ 144 or 244 by filtering and level shifting the bias signal $U_{BW}$ 152. The current augmentation circuit may include filter circuit 280, which may include resistor $R_F$ and capacitor $C_F$ with values chosen such that filter circuit 280 has a cut-off frequency corresponding to a period that may be greater than the length of the transient region of the non-zero off-time portion of the bias signal (e.g., cutoff frequency of 100 MHz having a period of 10 μs). As such, filter circuit 280 may substantially reduce the initial spike in bias signal $U_{BW}$ 152.

The current augmentation circuit may also include threshold circuit 290, which may reduce the magnitude of bias signal $U_{BW}$ 152 (i.e., level shift bias signal $U_{BW}$ 152) by the sum of the forward voltage drop of diode $D_2$ and the breakdown voltage of Zener diode $Z_1$. In this manner, the voltage drop across resistor $R_F$ can be adjusted such that the minimum current required by detection circuit 148 or 248 to assert overvoltage signal $U_{OV}$ 160 or 260 can be provided to input terminal BP 147 for a desired overvoltage threshold. For example, the voltage at input terminal BP 147 of controller 138 may be clamped to 6.4 volts. Indication of an overvoltage condition may be desired when the voltage on bias signal $U_{BW}$ 152 is 13 volts or higher. In other words, overvoltage threshold may be set to 13 volts. Value combinations of resistor $R_F$, capacitor $C_F$, Zener diode $Z_1$, and diode $D_2$ may be chosen to filter the transient region of bias signal $U_{BW}$ 152 and level shift the bias signal $U_{BW}$ 152 to provide the desired current at input terminal BP 147 to indicate an overvoltage condition, which may be at least 5.5 mA into input terminal BP 147 to cause detection circuit 148 or 248 to assert overvoltage signal $U_{OV}$ 160 or 260. Overvoltage threshold can be set to other levels by, for example, changing resistor $R_F$, adding another diode into threshold circuit 290, or the like. In addition, depending on the desired overvoltage threshold for indicating an overvoltage condition, Zener diode $Z_1$ may be optional, although typically at least one diode may be desirable to prevent negative voltage on input terminal BP 147. Without some diode protection, negative voltage may occur at input terminal BP 147, which could draw current from controller 138 through input terminal BP 147, which may be harmful to controller 138. In some embodiments, multiple diodes and Zener diodes may be included in the threshold circuit 290 of current augmentation circuit, although in others just one diode may be sufficient.

The current augmentation circuit may output augmented signal $U_{AUG}$ 144 or 244. In one embodiment, augmented signal $U_{AUG}$ 144 or 244 may become representative of the constant region of bias signal $U_{BW}$ 152, as illustrated by waveform 304. As output voltage $V_O$ 120 increases from voltage $V_A$ to voltage $V_B$ as illustrated in waveform 302, the magnitude of augmented signal $U_{AUG}$ 144 or 244, for example, may also increase from level $I_1$ to level $I_3$ as illustrated in waveform 306 because the magnitude of the constant portion of bias signal $U_{BW}$ 152 increases as well, as illustrated in waveform 304. Input signal $U_{IN}$ 146 going into input terminal BP 147 likewise increases from level $I_A$ to level $I_B$, as illustrated in waveform 308. When the magnitude of augmented signal $U_{AUG}$ 144 or 244 reaches level $I_3$ at time $t_1$, input signal $U_{IN}$ 146 going into input terminal BP 147 correspondingly increases to level $I_B$, which, in the example OVP circuit, may correspond to the minimum current (i.e., 5.5 mA) required at input terminal BP 147 to indicate an overvoltage condition. In other words, input signal $U_{IN}$ 146 going into input terminal BP 147 becomes large enough to cause detection circuit 148 or 248 to output a logic high signal as overvoltage signal $U_{OV}$ 160 or 260, thereby indicating an overvoltage condition. At time $t_2$, augmented signal $U_{AUG}$ 144 or 244 drops below level $I_3$, causing input signal $U_{IN}$ 146 to decrease from level $I_B$ as well. As a result, at time $t_2$, overvoltage signal $U_{OV}$ 160 or 260 as illustrated may transition from logic high to logic low, indicating that there may no longer be an overvoltage condition.

Figure 4:
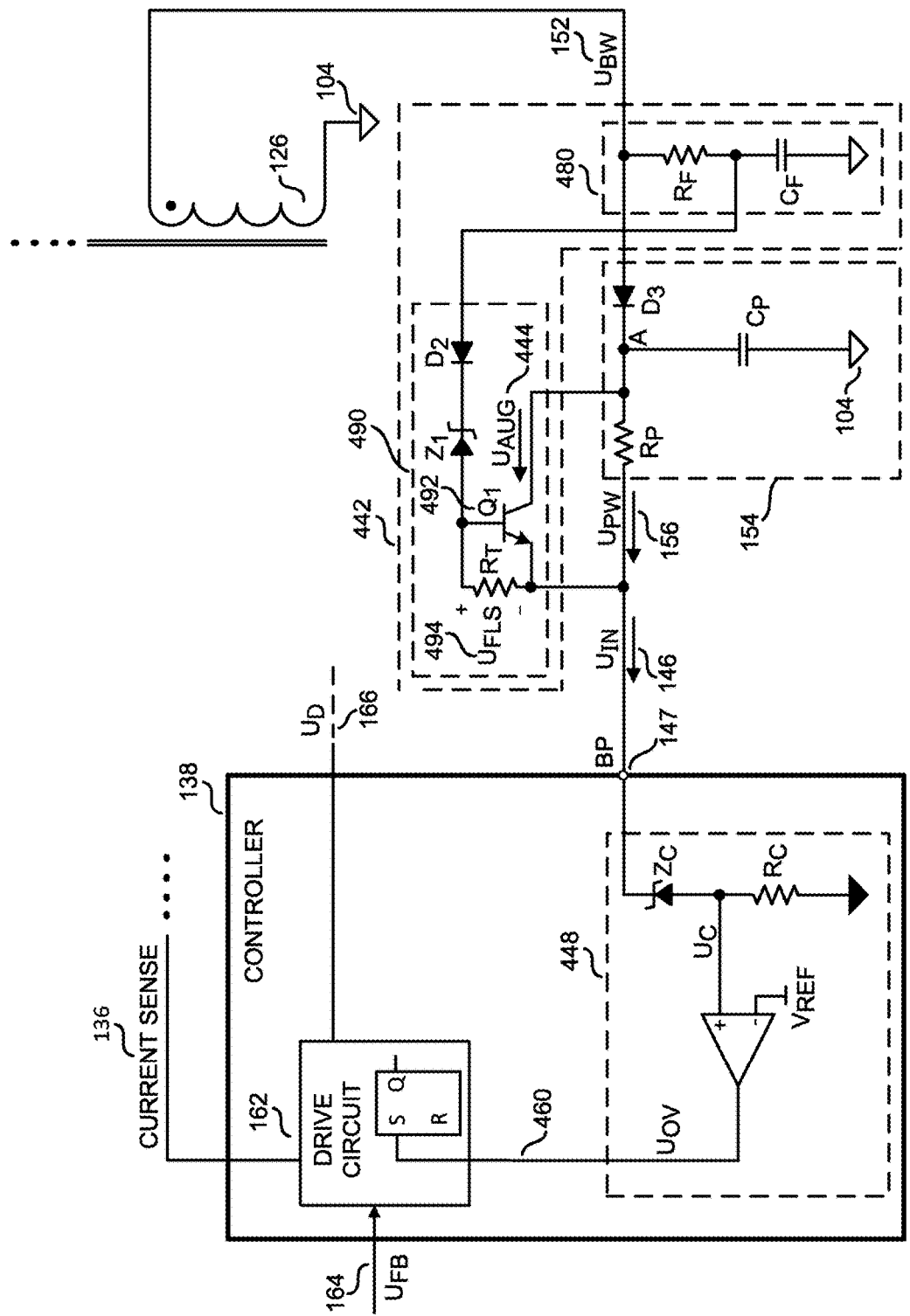
FIG. 4 is a circuit diagram illustrating another example of an OVP circuit that can be used in the power converter of FIG. 1 in accordance with the teachings of the present disclosure.

FIG. 4 illustrates another example OVP circuit that may be used in power converter 100. The example OVP circuit may include current augmentation circuit 442 as well as detection circuit 448. In one embodiment, detection circuit 448 may be the same as detection circuit 248 of FIG. 2, including Zener diode $Z_C$ and resistor $R_C$. Therefore, overvoltage signal $U_{OV}$ 460 may be the same as overvoltage signal $U_{OV}$ 160 or 260. Similarly, in some embodiments, elements 104, 126, 136, 138, 147, 154, 156, 162, 164, and 166 may be the same as similarly numbered elements in FIG. 1 and FIG. 2. Current augmentation circuit 442, however, illustrates an embodiment with a modified threshold circuit and a reversed order of level shifting and filtering. In this example, filter circuit 480 may be coupled to receive bias signal $U_{BW}$ 152, and the output of filter circuit 480 may be coupled to the input of threshold circuit 490. Other than these different couplings, filter circuit 480 may be the same as filter circuit 280 with resistor $R_F$ and capacitor $C_F$, which may be configured to filter signals based on a cut-off frequency as discussed above.

Threshold circuit 490 may have an input terminal coupled to the output of filter circuit 480 as well as two output terminals: a first output terminal coupled to input terminal BP 147 and a second output terminal coupled to node A of power circuit 154. Threshold circuit 490 may include transistor $Q_1$ 492 and resistor $R_T$ in addition to diode $D_2$ and Zener diode $Z_1$. A first terminal of transistor $Q_1$ 492 may be coupled to the first output terminal of threshold circuit 490 (and to input terminal BP 147). A second terminal of transistor $Q_1$ 492 may be coupled to Zener diode $Z_1$. A third terminal of transistor Q1 492 may be coupled to the second output terminal of threshold circuit 490 (and to node A). Resistor $R_T$ may be coupled between the first terminal and second terminal of transistor $Q_1$ 492 (between the first output terminal of threshold circuit 490 and Zener diode $Z_1$). In one example, transistor Q1 492 may be a bipolar junction transistor, and the first terminal may correspond to the emitter, the second terminal may correspond to the base, and the third terminal may correspond to the collector of transistor Q1 492.

Threshold circuit 490 may receive a filtered version of bias signal $U_{BW}$ 152 from filter circuit 480. Threshold circuit 490 may generate a filtered level shifted signal $U_{FLS}$ 494 across resistor $R_T$ by reducing the magnitude of the filtered bias signal (i.e., level shifting the filtered bias signal) by an amount that may be equal to the sum of the forward voltage drop of diode $D_2$ and the breakdown voltage of Zener diode $Z_1$. In one embodiment, filtered level shifted signal $U_{FLS}$ 494 may be a voltage signal representing the voltage difference between the first terminal and the second terminal of transistor $Q_1$ 492. In one example operation, when filtered level shifted signal $U_{FLS}$ 494 becomes greater than a threshold voltage of transistor $Q_1$ 492, transistor $Q_1$ 492 may turn ON and present a very small impedance (i.e., similar to a short circuit) between the first output terminal and the second output terminal of transistor $Q_1$ 492. In contrast, when filtered level shifted signal $U_{FLS}$ 492 is less than the threshold voltage of transistor $Q_1$ 492, transistor $Q_1$ 492 remains in OFF mode and presents a large impedance (i.e., similar to an open circuit) between the first output terminal and the second output terminal.

In an example operation with an overvoltage condition, when filtered level shifted signal $U_{FLS}$ 494 is greater than the threshold voltage of transistor $Q_1$ 492 (which may be indicative of an overvoltage condition at the output of power converter 100), threshold circuit 490 may begin drawing large amounts of current (i.e., at least 4.5 mA) from node A toward the first output of threshold circuit 490. This draw of current toward the first output of threshold circuit 490 may be similar or equivalent to outputting a large augmented signal $U_{AUG}$ 444. As discussed above, an increased augmented signal $U_{AUG}$ 444 (or similarly the draw of large current toward the first output of threshold circuit 490) may force enough current into input terminal BP 147 to cause detection circuit 448 to output a logic high signal as overvoltage signal $U_{OV}$ 460 that may indicate an overvoltage condition to drive circuit 162. In some embodiments, causing detection circuit 448 to output a logic high signal may require providing sufficient current to input terminal BP 147 to generate a comparison signal $U_C$ that is greater than the reference voltage $V_{REF}$ of the comparator of detection circuit 448. In one embodiment, the minimum current that should be provided to input terminal BP 147 to cause detection circuit 448 to output a logic signal may be 5.5 mA.

In contrast to an overvoltage condition, during normal operation with the output voltage (e.g., output voltage $V_O$ 120) within an accepted range, filtered level shifted signal $U_{FLS}$ 494 may be less than the threshold voltage of transistor $Q_1$ 492. Under this condition, transistor $Q_1$ 492 may conduct little to no current, augmented signal $U_{AUG}$ 444 may be significantly zero, and the only signal going into input terminal BP 147 may be power signal $U_{PW}$ 156 (which may be around 1 mA). In one embodiment, power signal $U_{PW}$ 156 may typically be too small to generate a comparison signal $U_C$ that is greater than the reference voltage $V_{REF}$. Without a large enough comparison signal $U_C$, the comparator of detection circuit 448 may not output a logic high signal and hence, overvoltage signal $U_{OV}$ 460 may remain logic low to indicate that there may not be an overvoltage condition.

Figure 5:
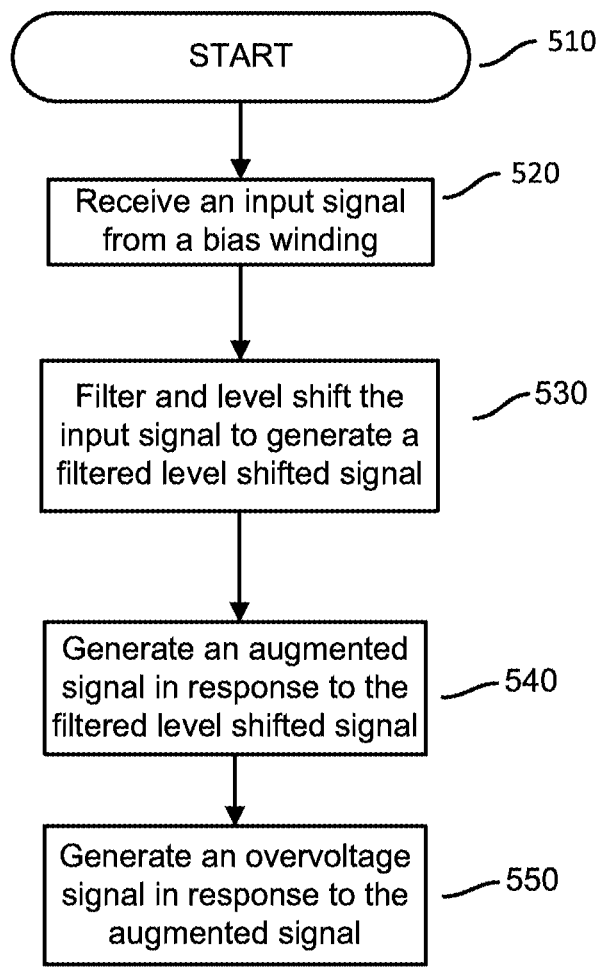
FIG. 5 is a flow diagram illustrating an example method for generating an overvoltage signal from a bias winding of a transformer of a power converter in accordance with the teachings of the present disclosure.

FIG. 5 illustrates a flow diagram of example method 500 for generating an overvoltage signal from a bias winding of a transformer of a power converter (e.g., power converter 100) in accordance with the teachings of the present disclosure. For illustrative purposes, reference is made to elements of FIG. 1, FIG. 2, and FIG. 4, although method 500 is applicable to combinations of these examples as well as many other circuit variants beyond these examples.

Method 500 may begin at block 510, where a power converter may begin operation. At block 520, an overvoltage protection circuit (e.g., OVP circuit 140) may receive an input signal (e.g., bias signal $U_{BW}$ 152). The input signal may come from a bias winding (e.g., bias winding 126) of a transformer (e.g., transformer T1 124). In one example, the input signal may represent the voltage across the bias winding. In some embodiments, the input signal may also be used to generate a power signal (e.g., $U_{PW}$ 156).

At block 530, the overvoltage protection circuit may filter and level shift the input signal to generate a filtered level shifted signal (e.g., $U_{FLS}$ 282 or 494). In one embodiment, the overvoltage protection circuit may include a filter circuit (e.g., filter circuit 280 or 480) that may filter the transient portion of the input signal and a threshold circuit (e.g., threshold circuit 290 or 490) that may level shift the input signal. The filtered level shifted signal may be representative of the constant portion of the bias signal from the bias winding of the transformer. The filtered level shifted signal may be either a current signal (e.g., as in FIG. 2) or a voltage signal (e.g., as in FIG. 4).

At block 540, a current augmentation circuit (e.g., current augmentation circuit 142, 242, or 442) may output an augmented signal (e.g., $U_{AUG}$ 144, 244 or 444) based on the filtered level shifted signal. The current augmentation circuit may be part of the overvoltage protection circuit, and in some cases may include the threshold circuit and filter circuit discussed above with regard to block 530. In one example, the augmented signal may be the same as the filtered level shifted signal.

At block 550, a detection circuit (e.g., detection circuit 148, 248, or 448) may output an overvoltage signal (e.g., $U_{OV}$ 160, 260 or 460) based on the augmented signal of block 540. The detection circuit may be part of the overvoltage protection circuit, and may also be part of a controller (e.g., controller 138). A power signal may be generated from the input signal from the bias winding of the transformer, and the power signal may be combined with the augmented signal of block 540 to generate an input signal (e.g., $U_{IN}$ 146) for a controller input terminal (e.g., input terminal BP 147) that may be coupled to the detection circuit. In one example, if the sum of the augmented signal and the power signal that is input into the input terminal BP 147 (and into the detection circuit) is greater than a threshold (e.g., 5.5 mA), the detection circuit may output a logic high as the overvoltage signal. Conversely, if the sum of the augmented signal and the power signal that received at the input terminal (and into the detection circuit) is less than a threshold, the detection circuit may output a logic low signal as the overvoltage signal. In one example, a logic high overvoltage signal may indicate an overvoltage condition at the output of the power converter.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An overvoltage detection circuit for a power converter, comprising:
   a current augmentation circuit coupled to receive a sense signal representative of an output voltage of the power converter only during a portion of an off time of a power switch of the power converter, wherein the current augmentation circuit is further coupled to output an augmented signal; and
   a detection circuit coupled to receive the augmented signal from the augmentation circuit and a power signal representative of a rectified version of the sense signal at a same input terminal, wherein the detection circuit is operable to output an overvoltage detection signal in response to a sum of the augmented signal and the power signal, wherein the augmented signal and the power signal originate from a bias winding, the overvoltage detection signal being representative of an overvoltage condition in the output voltage of the power converter.

2. The overvoltage detection circuit of claim 1, wherein the current augmentation circuit comprises:
   a threshold circuit coupled to receive the sense signal, wherein the threshold circuit is coupled to reduce a voltage of the sense signal and is coupled to output a level shifted sense signal; and
   a filter circuit coupled to receive the level shifted sense signal, wherein the filter circuit is coupled to filter a transient portion of the level shifted sense signal to output a filtered level shifted sense signal.

3. The overvoltage detection circuit of claim 2, wherein the filtered level shifted sense signal is the augmented signal.

4. The overvoltage detection circuit of claim 2, wherein the threshold circuit comprises:
   a first diode, wherein an anode of the first diode is coupled to receive the sense signal; and
   a first Zener diode, wherein a cathode of the first Zener diode is coupled to a cathode of the first diode, wherein the threshold circuit is operable to output the level shifted sense signal at an anode of the first Zener diode.

5. The overvoltage detection circuit of claim 2, wherein the filter circuit comprises:
   a first resistor, wherein a first terminal of the first resistor is coupled to receive the level shifted sense signal; and
   a first capacitor coupled between a second terminal of the first resistor and ground, wherein the filter circuit is operable to output the filtered level shifted sense signal at the second terminal of the first resistor.

6. The overvoltage detection circuit of claim 1, wherein the current augmentation circuit comprises:
   a filter circuit coupled to receive the sense signal, wherein the filter circuit is coupled to filter a transient portion of the sense signal and is coupled to output a filtered sense signal; and
   a threshold circuit coupled to receive the filtered sense signal, wherein the threshold circuit is coupled to reduce a voltage of the filtered sense signal and is coupled to output a filtered level shifted sense signal.

7. The overvoltage detection circuit of claim 6, wherein the filtered level shifted sense signal is the augmented signal.

8. The overvoltage detection circuit of claim 6, wherein the filter circuit comprises:
   a first resistor, wherein a first terminal of the first resistor is coupled to receive the sense signal; and a first capacitor coupled between a second terminal of the first resistor and ground, wherein the filter circuit is operable to output the filtered sense signal at the second terminal of the first resistor.

9. The overvoltage detection circuit of claim 6, wherein the threshold circuit comprises:
a first diode, wherein an anode of the first diode is coupled to receive the filtered sense signal; and
a first Zener diode, wherein a cathode of the first Zener diode is coupled to a cathode of the first diode, wherein the threshold circuit is operable to output the filtered level shifted sense signal at an anode of the first Zener diode.

10. The overvoltage detection circuit of claim 1, wherein the detection circuit comprises:
a clamp circuit coupled to receive the augmented signal from the augmentation circuit, wherein the clamp circuit is operable to output a comparison signal; and
a comparator coupled to receive the comparison signal from the clamp circuit, wherein the comparator is operable to output the overvoltage detection signal based on a comparison of the comparison signal with a reference voltage.

11. The overvoltage detection circuit of claim 10, wherein the clamp circuit comprises:
a second Zener diode, wherein a cathode of the second Zener diode is coupled to receive the augmented signal; and
a second resistor coupled between an anode of the second Zener diode and ground, wherein the clamp circuit is operable to output the comparison signal at an anode of the second Zener diode.

12. The overvoltage detection circuit of claim 10, wherein the comparator comprises an operational amplifier, and wherein a non-inverting terminal of the operational amplifier is coupled to receive the comparison signal from the clamp circuit and an inverting terminal of the operational amplifier is coupled to receive the reference voltage.

13. The overvoltage detection circuit of claim 1, further comprising:
a power circuit coupled to receive the sense signal representative of the output voltage of the power converter, wherein the power circuit is operable to output the power signal, and wherein the input terminal is further coupled to receive the power signal from the power circuit.

14. The overvoltage detection circuit of claim 13, wherein the power circuit comprises:
a second diode, wherein an anode of the second diode is coupled to receive the sense signal;
a second capacitor coupled between a cathode of the second diode and ground; and
a third resistor, wherein a first terminal of the third resistor is coupled to the cathode of the second diode, and wherein the power circuit is operable to output the power signal at a second terminal of the third resistor.

15. The overvoltage detection circuit of claim 1, wherein the detection circuit is included within the controller of the power converter, and wherein the threshold circuit and the filter circuit are external to the controller of the power converter.

16. A power converter, comprising:
a power switch;
a controller for controlling the power switch to regulate the power converter; and
an overvoltage detection circuit comprising:
a current augmentation circuit coupled to receive a sense signal representative of an output voltage of the power converter only during a portion of an off time of the power switch, wherein the current augmentation circuit is further coupled to output an augmented signal; and
a detection circuit coupled to receive the augmented signal from the augmentation circuit and a power signal representative of a rectified version of the sense signal at a same input terminal, wherein the detection circuit is operable to output an overvoltage detection signal in response to a sum of the augmented signal and the power signal, wherein the augmented signal and the power signal originate from a bias winding, the overvoltage detection signal being representative of an overvoltage condition in the output voltage of the power converter.

17. The power converter of claim 16, wherein the current augmentation circuit comprises:
a threshold circuit coupled to receive the sense signal, wherein the threshold circuit is coupled to reduce a voltage of the sense signal and is coupled to output a level shifted sense signal; and
a filter circuit coupled to receive the level shifted sense signal, wherein the filter circuit is coupled to filter a transient portion of the level shifted sense signal to output a filtered level shifted sense signal.

18. The power converter of claim 17, wherein the filtered level shifted sense signal is the augmented signal.

19. The power converter of claim 17, wherein the detection circuit is included within the controller of the power converter, and wherein the threshold circuit and the filter circuit are external to the controller of the power converter.

20. The power converter of claim 17, wherein the threshold circuit comprises:
a first diode, wherein an anode of the first diode is coupled to receive the sense signal; and
a first Zener diode, wherein a cathode of the first Zener diode is coupled to a cathode of the first diode, wherein the threshold circuit is operable to output the filtered level shifted sense signal at an anode of the first Zener diode.

21. The power converter of claim 17, wherein the filter circuit comprises:
a first resistor, wherein a first terminal of the first resistor is coupled to receive the level shifted sense signal; and
a first capacitor coupled between a second terminal of the first resistor and ground, wherein the filter circuit is operable to output the filtered level shifted sense signal at the second terminal of the first resistor.

22. The power converter of claim 16, wherein the current augmentation circuit includes:
a filter circuit coupled to receive the sense signal, wherein the filter circuit is coupled to filter a transient portion of the sense signal and is coupled to output a filtered sense signal; and
a threshold circuit coupled to receive the filtered sense signal, wherein the threshold circuit is coupled to reduce a voltage of the filtered sense signal and is coupled to output the filtered level shifted sense signal.

23. The power converter of claim 22, wherein the filtered level shifted sense signal is the augmented signal.

24. The power converter of claim 22, wherein the detection circuit is included within the controller of the power converter, and wherein the threshold circuit and the filter circuit are external to the controller of the power converter.

25. The power converter of claim 22, wherein the filter circuit comprises:
- a first resistor, wherein a first terminal of the first resistor is coupled to receive the sense signal; and
- a first capacitor coupled between a second terminal of the first resistor and ground, wherein the filter circuit is operable to output the filtered sense signal at the second terminal of the first resistor.

26. The power converter of claim 22, wherein the threshold circuit comprises:
- a first diode, wherein an anode of the first diode is coupled to receive the filtered sense signal; and
- a first Zener diode, wherein a cathode of the first Zener diode is coupled to a cathode of the first diode, wherein the threshold circuit is operable to output the filtered level shifted sense signal at an anode of the first Zener diode.

27. The power converter of claim 16, wherein the detection circuit comprises:
- a clamp circuit coupled to receive the augmented signal from the augmentation circuit, wherein the clamp circuit is operable to output a comparison signal; and
- a comparator coupled to receive the comparison signal from the clamp circuit, wherein the comparator is operable to output the overvoltage detection signal based on a comparison of the comparison signal with a reference voltage.

28. The power converter of claim 27, wherein the clamp circuit comprises:
- a second Zener diode, wherein the cathode of the second Zener diode is coupled to receive the augmented signal; and
- a second resistor coupled between an anode of the second Zener diode and ground, wherein the clamp circuit is operable to output the comparison signal at an anode of the second Zener diode.

29. The power converter of claim 27, wherein the comparator comprises an operational amplifier, and wherein a non-inverting terminal of the operational amplifier is coupled to receive the comparison signal from the clamp circuit and an inverting terminal of the operational amplifier is coupled to receive the reference voltage.

30. The power converter of claim 16, further comprising:
- a power circuit coupled to receive the sense signal representative of the output voltage of the power converter, wherein the power circuit is operable to output the power signal, and wherein the input terminal is coupled to receive the power signal from the power circuit.

31. The power converter of claim 30, wherein the power circuit comprises:
- a second diode, wherein an anode of the second diode is coupled to receive the sense signal;
- a second capacitor coupled between a cathode of the second diode and ground; and
- a third resistor, wherein a first terminal of the third resistor is coupled to the cathode of the second diode, and wherein the power circuit is operable to output the power signal at a second terminal of the third resistor.

* * * * *